(12) United States Patent
Bouton et al.

(10) Patent No.: US 12,527,233 B2
(45) Date of Patent: Jan. 13, 2026

(54) CERAMIC SHEETS AND METHODS OF CUTTING CERAMIC SHEETS

(71) Applicant: CORNING INCORPORATED, Corning, NY (US)

(72) Inventors: William Joseph Bouton, Big Flats, NY (US); Alexander Lee Cuno, Sayre, PA (US); Heather Nicole Vanselous, Corning, NY (US); Cheng-Gang Zhuang, Horseheads, NY (US)

(73) Assignee: CORNING INCORPORATED, Corning, NY (US)

( * ) Notice: Subject to any disclaimer, the term of this patent is extended or adjusted under 35 U.S.C. 154(b) by 240 days.

(21) Appl. No.: 18/232,590

(22) Filed: Aug. 10, 2023

(65) Prior Publication Data

US 2024/0065114 A1  Feb. 22, 2024

Related U.S. Application Data

(60) Provisional application No. 63/399,419, filed on Aug. 19, 2022.

(51) Int. Cl.
*H10N 60/01* (2023.01)
*B26D 7/34* (2006.01)
*B65H 35/02* (2006.01)
*H10N 60/85* (2023.01)

(52) U.S. Cl.
CPC ........... *H10N 60/0632* (2023.02); *B26D 7/34* (2013.01); *B65H 35/02* (2013.01); *H10N 60/0408* (2023.02); *H10N 60/857* (2023.02); *B65H 2301/5155* (2013.01)

(58) Field of Classification Search
CPC .. B65H 2301/5155; B65H 35/02; B26D 7/34; H10N 60/857; H10N 60/0632
See application file for complete search history.

(56) References Cited

U.S. PATENT DOCUMENTS

| | | | |
|---|---|---|---|
| 4,760,365 A | 7/1988 | Bailey et al. | |
| 4,874,919 A | 10/1989 | Bransden et al. | |
| 2002/0157225 A1* | 10/2002 | Sakamoto | H05K 3/4611 |
| | | | 29/25.42 |
| 2016/0009586 A1 | 1/2016 | Bookbinder et al. | |

FOREIGN PATENT DOCUMENTS

| | | |
|---|---|---|
| CN | 110369882 A | 10/2019 |
| CN | 112828475 A | 5/2021 |
| EP | 0279505 B1 | 7/1990 |

(Continued)

OTHER PUBLICATIONS

Machine translation of KR 100366889 B1 (Year: 2003).*

(Continued)

*Primary Examiner* — Vishal I Patel

(57) ABSTRACT

A ceramic sheet includes a first surface, a second surface opposite the first surface, and a pair of parallel edges extending therebetween. A thickness of the ceramic sheet is defined between the first and second surfaces, a width of the ceramic sheet is defined between the pair of parallel edges, and a length of the ceramic sheet is defined as a dimension orthogonal to both the thickness and the width. The thickness is less than or equal to 100 μm, the length is greater than or equal to 10 m, and the width is less than or equal to 12 mm. The ceramic sheet has a grain size of less than or equal to 0.2 μm and a porosity of less than or equal to 5%.

17 Claims, 11 Drawing Sheets

(56) References Cited

FOREIGN PATENT DOCUMENTS

| EP | 2669039 A1 | | 12/2013 | |
|---|---|---|---|---|
| KR | 100366889 B1 | * | 1/2003 | |
| KR | 10-1391970 B1 | | 5/2014 | |
| WO | 2020/074492 A1 | | 4/2020 | |
| WO | 2020/201316 A1 | | 10/2020 | |
| WO | 2021/046067 A1 | | 3/2021 | |
| WO | WO-2021193738 A1 | * | 9/2021 | ............. B28B 11/14 |

OTHER PUBLICATIONS

Machine translation of WO 2021/193738 A1 (Year: 2021).*
Creely et al., "Overview of the SPARC tokamak", J. Plasma Phys., 86(2020): 865860502, 25 pages.
Iio et al., "Research and development of future radiation-resistant superconducting magnets with mineral insulated REBCO coils", IEEE Transactions on Applied Superconductivity, 30(2020): 46000505.
Lu et al., "Insulation of coated conductors for high field magnet applications", IEEE Transactions on Applied Superconductivity, 22(2012): 7700304.
Ogitsu et al., "Development of radiation-tolerant HTS magnet for muon production solenoid", Instruments, 4(2020): 30, 13 pages.
Sheehan et al., "Solution deposition planarization of long-length flexible substrates", Applied Physics Letters, 98(2011): 071907, 3 pages.
Xu et al., "A review of coated conductor development", Tsinghua Science & Technology, 8(2003): 342, 28 pages.
Zhuang et al., "Flexibility matters: High purity, thin, flexible alumina ribbon ceramic", Ceramic & Glass Manufacturing, 1(2020):54. Published within ACerS Bulletin, 99(2020): pp. 54-58.

* cited by examiner

CERAMIC SHEETS AND METHODS OF CUTTING CERAMIC SHEETS

This application claims the benefit of priority under 35 U.S.C. § 119 of U.S. Provisional Application Ser. No. 63/399,419 filed on Aug. 19, 2022, the content of which is relied upon and incorporated herein by reference in its entirety.

FIELD

The present specification generally relates to ceramic sheets and, in particular, to methods of cutting ceramic sheets to create long, thin ceramic strips for use in high temperature superconductor ("HTS") applications.

TECHNICAL BACKGROUND

Ceramic materials are increasingly popular for application in HTS devices that may benefit from improved dielectric constants and radiation hardness. However, conventional ceramic sheets may not have the requisite dimensions needed for utilization in HTS applications.

Accordingly, a need exists for a method of cutting sheets to form ceramic strips with dimensions which are conducive to being utilized in HTS applications.

SUMMARY

According to a first aspect A1, a ceramic sheet includes a first surface, a second surface opposite the first surface, and a pair of parallel edges extending therebetween, a thickness of the sheet being defined as a distance between the first and second surfaces, a width of the ceramic sheet being defined as a distance between the pair of parallel edges, and a length of the ceramic sheet being defined as a dimension orthogonal to both the thickness and the width, wherein the thickness is less than or equal to 100 µm, the length is greater than or equal to 10 m, and the width less than or equal to 12 mm and the ceramic sheet has a grain size of less than or equal to 0.2 µm and a porosity of less than or equal to 5%.

A second aspect A2 includes the ceramic sheet according to the first aspect A1, wherein the ceramic sheet has at least one of a tensile strength greater than or equal to 400 MPa, a radiation resistance greater than or equal to 50 MGy, an inductance less than or equal to 0.1 mH, a thermal conductivity greater than or equal to 1 W/mK, and a resistivity greater than or equal to $5 \times 10^{-5}$ Ω-cm, or combinations thereof.

A third aspect A3 includes the ceramic sheet according to the first aspect A1, wherein the ceramic sheet has a thickness less than or equal to 50 µm, a tensile strength greater than or equal to 600 MPa, an inductance of less than or equal to 0.1 mH, an oxidation resistance of greater than or equal to 1000° C., and is chemically inert to rare-earth barium copper oxide.

A fourth aspect A4 includes the ceramic sheet according to any of the first through third aspects A1-A3, wherein the width of the ceramic sheet is greater than or equal to 1 mm and less than or equal to 10 mm.

A fifth aspect A5 includes the ceramic sheet according to any of the first through fourth aspects A1-A4, wherein the length of the ceramic sheet is greater than or equal to 25 m.

A sixth aspect A6 includes the ceramic sheet according to any of the first through fifth aspects A1-A5, wherein the length of the ceramic sheet is greater than or equal to 50 m.

A seventh aspect A7 includes the ceramic sheet according to any of the first through sixth aspects A1-A6, wherein the thickness of the sheet is greater than or equal to 20 µm and less than or equal to 40 µm.

An eighth aspect A8 includes the ceramic sheet according to any of the first through seventh aspects A1-A7, wherein the ceramic sheet has a porosity of less than or equal to 0.5% by volume.

A ninth aspect A9 includes the ceramic sheet according to any of the first through eighth aspects A1-A8, wherein the ceramic sheet comprises zirconia, alumina, spinel, garnet, cordierite, mullite, perovskite, pyrochlore, silicon carbide, silicon nitride, boron carbide, titanium diboride, silicon alumina nitride, aluminum oxynitride, or combinations thereof.

A tenth aspect A10 includes the ceramic sheet according to any of the first through ninth aspects A1-A9, wherein the ceramic sheet further comprises a coating layer disposed on at least one of the first surface or the second surface, the coating layer comprising aluminum, nickel, silver, gold, copper, zinc, or combinations thereof.

An eleventh aspect A11 includes the ceramic sheet according to the ninth aspect A9, wherein the coating layer has a thickness greater than or equal to 100 nm.

A twelfth aspect A12 includes the ceramic sheet according to any of the first through the eleventh A1-A11 aspects, wherein the ceramic sheet has a bend flexural strength greater than or equal to 600 MPa.

A thirteenth aspect A13 includes the ceramic sheet according to any of the first through the twelfth aspects A1-A12, wherein the ceramic sheet has a bending radius of greater than or equal to 2.5 mm.

A fourteenth aspect A14 includes the ceramic sheet according to any of the first through the thirteenth aspects A1-A13, wherein the ceramic sheet is wound on a spool.

A fifteenth aspect A15 includes the ceramic sheet according to any of the first through the fourteenth aspects A1-A14, wherein the ceramic sheet is a substrate in a high-temperature superconductor.

A sixteenth aspect A16 includes the ceramic sheet according to any of the first through the fourteenth aspects A1-A14, wherein the ceramic sheet is an radiation insulation layer in a high-temperature superconductor.

According to a seventeenth aspect A17, a method of cutting a ceramic sheet comprises: conveying a ceramic sheet wound around a first spool from the first spool to a second spool, the ceramic sheet comprising a first surface, a second surface opposite the first surface, and a pair of parallel edges extending therebetween, a thickness of the sheet being defined as a distance between the first and second surfaces, a width of the ceramic sheet being defined as a distance between the pair of parallel edges, and a length of the ceramic sheet being a dimension orthogonal to both the thickness and the width, wherein: the thickness of the ceramic sheet is less than or equal to 100 µm, the length of the ceramic sheet is greater than or equal to 10 m, and the width of the ceramic sheet is greater than 12 mm; and creating a first slit in the ceramic sheet to form a first section and a second section, wherein: the first slit extends along the length of the ceramic sheet, and the first section has a thickness less than or equal to 100 µm, a length greater than or equal to 10 m, and a width less than or equal to 12 mm.

An eighteenth aspect A18 includes the method according to the seventeenth aspect A17, further comprising depositing a first coating layer on the ceramic sheet that extends along the length of the ceramic sheet A nineteenth aspect A19 includes the method according to the seventeenth aspect A18, wherein the first coating layer comprises nickel, yttria-stabilized zirconia, alumina, cerium oxide, magnesium oxide, titanium, copper, or combinations thereof.

A twentieth aspect A20 includes the method according to the nineteenth aspect A19, wherein the first coating layer comprises yttria-stabilized zirconia, alumina, cerium oxide, magnesium oxide, or combinations thereof.

A twenty-first aspect A21 includes the method according to the twentieth aspect A20, wherein the method further comprises depositing a second coating layer on the first coating layer deposited on the ceramic sheet that extends along the length of the ceramic sheet, the second coating layer comprising alumina, yttrium oxide, yttria-stabilized zirconia, cerium oxide, magnesium oxide, lanthanum manganite, or combinations thereof.

A twenty-second aspect A22 includes the method according to the twenty-first aspect A21, wherein the method further comprises depositing a third coating layer on the second coating layer that extends along the length of the ceramic sheet, the third coating layer comprising rare-earth barium copper oxide.

A twenty-third aspect A23 includes the method according to any of the eighteenth through the twenty-second aspects A18-A22, wherein the first coating layer comprises titanium, nickel, copper, or combinations thereof.

A twenty-fourth aspect A24 includes the method according to the twenty-third aspect A23, wherein the method further comprises depositing a second coating layer on the first coating layer deposited on the ceramic sheet that extends along the length of the ceramic sheet, the second coating layer comprising titanium, nickel, copper, or combinations thereof.

A twenty-fifth aspect A25 includes the method according to the twenty-fourth aspect A24, wherein the method further comprises depositing a third coating layer on top of the second coating layer deposited on the first coating layer of the ceramic sheet, the third coating layer comprising a high-temperature superconductivity tape.

A twenty-sixth aspect A26 includes the method according to any of the seventeenth through the twenty-fifth aspects A17-A25, wherein the step of creating a slit comprises a cutting step consisting of non-diffracting beam processing, laser ablation, carbon monoxide crack propagation, dice sawing, diamond wire sawing, water jetting, scribing and breaking, or combinations thereof.

A twenty-seventh aspect A27 includes the method according to any of the seventeenth through the twenty-sixth aspects A17-A26, wherein the method further comprises separating the first section from the second section.

A twenty-eighth aspect A28 includes the method according to the twenty-seventh aspect A27, wherein the step of separating comprises applying mechanical stress along the first slit to cause separation of the first section from the second section.

A twenty-ninth aspect A29 includes the method according to the twenty-seventh aspect A27, wherein the step of separating comprises applying thermal stress along the first slit to cause separation of the first section from the second section.

A thirtieth aspect A30 includes the method according to any of the seventeenth through the twenty-ninth aspects A17-A29, wherein the width of the first section is half the width of the ceramic sheet.

A thirty-first aspect A31 includes the method according to any of the seventeenth through the thirtieth aspects A17-A30, wherein the pair of parallel edges of the ceramic sheet comprise a first edge and a second edge, and wherein the first slit is less than or equal to 5 mm from the first edge in a direction toward the second edge.

A thirty-second aspect A32 includes the method according to the thirty-first aspect A31, wherein the first slit is less than or equal to 1 mm from the first edge in a direction toward the second edge.

A thirty-third aspect A33 includes the method according to any of the seventeenth through the thirty-second aspects A17-A32, wherein the method further comprises creating a second slit in the ceramic sheet to form a third section.

A thirty-fourth aspect A34 includes the method according to any of the seventeenth through the thirty-third aspects A17-A33, wherein the method is a continuous roll-to-roll method.

According to a thirty-fifth aspect A35, a method of cutting a ceramic sheet, comprises the steps of: loading a ceramic sheet wound around a first spool on a rotary stage configured to rotate the first spool about its central axis, the ceramic sheet comprising a first surface, a second surface opposite the first surface, and a pair of parallel edges extending therebetween, a thickness of the ceramic sheet being defined as a distance between the first and second surfaces, a width of the ceramic sheet being defined as a distance between the pair of parallel edges, and a length of the ceramic sheet being a dimension orthogonal to both the thickness and the width, wherein: the thickness of the ceramic sheet is less than or equal to 100 µm, the length of the ceramic sheet is greater than or equal to 10 m, and the width of the ceramic sheet is greater than 12 mm; and creating, using the cutting tool, a first slit on the ceramic sheet to form a first section and a second section, wherein: the first slit extends along the length of the ceramic sheet, and the first section has a thickness less than or equal to 100 µm, a length greater than or equal to 10 m, and a width less than or equal to 12 mm.

A thirty-sixth aspect A36 includes the method according to the thirty-fifth aspect A35, further comprising positioning a cutting tool over the first spool at a first slitting location.

A thirty-seventh aspect A37 includes the method according to the thirty-sixth aspect A36, further comprising depositing a first coating layer on the ceramic sheet that extends along the length of the ceramic sheet.

A thirty-eighth aspect A38 includes the method according to the thirty-seventh aspect A37, wherein the first coating layer comprises nickel, yttria-stabilized zirconia, alumina, cerium oxide, magnesium oxide, rare-earth barium copper oxide, titanium, copper, or combinations thereof.

A thirty-ninth aspect A39 includes the method according to the thirty-eighth aspect A38, wherein the first coating layer comprises yttria-stabilized zirconia, alumina, cerium oxide, magnesium oxide, or combinations thereof.

A fortieth aspect A40 includes the method according to the thirty-ninth aspect A39, wherein the method further comprises depositing a second coating layer on the first coating layer deposited on at least one of the first surface or the second surface of the ceramic sheet that extends along the length of the ceramic sheet, the second coating layer comprising alumina, yttrium oxide, yttria-stabilized zirconia, cerium oxide, magnesium oxide, lanthanum manganite, or combinations thereof.

A forty-first aspect A41 includes the method according to the fortieth aspect A40, the method further comprises depositing a third coating layer on the second coating layer that extends along the length of the ceramic sheet, the third coating layer comprising rare-earth barium copper oxide.

A forty-second aspect A42 includes the method according to the thirty-eighth aspect A38, wherein the first coating layer comprises titanium, nickel, copper, or combinations thereof.

A forty-third aspect A43 includes the method according to the forty-second aspect A42, wherein the method further comprises depositing a second coating layer on at least one of the first surface or the second surface of the ceramic sheet that extends along the length of the ceramic sheet, the second coating layer comprising titanium, nickel, copper, or combinations thereof.

A forty-fourth aspect A44 includes the method according to the forty-third aspect A43, wherein the method further comprises depositing a third coating layer on top of the second coating layer, the third coating layer comprising a high-temperature superconductivity tape.

A forty-fifth aspect A45 includes the method according to any of the thirty-fifth through the forty-fourth aspects, A35-A44, wherein the step of creating a slit comprises non-diffracting beam processing, laser ablation, carbon monoxide crack propagation, dice sawing, diamond wire sawing, water jetting, scribing and breaking, or combinations thereof.

A forty-sixth aspect A46 includes the method according to any of the thirty-fifth through the forty-fifth aspects A35-A45, wherein the pair of parallel edges of the ceramic sheet comprise a first edge and a second edge, and wherein the first slit is less than or equal to 5 mm from the first edge in a direction toward the second edge.

A forty-seventh aspect A47 includes the method according any of the thirty-fifth through the forty-sixth aspects A35-A46, wherein the first slit is less than or equal to 1 mm from the first edge in a direction toward the second edge.

A forty-eighth aspect A48 includes the method according to any of the thirty-fifth through the forty-fifth aspects A35-A47, further comprising positioning the cutting tool over the first spool at a second slitting location and creating a second slit on the ceramic sheet material to form a second section and a third section, wherein: the second slit extends along the length of the ceramic sheet material.

A forty-ninth aspect A49 includes the method according to the forty-eighth aspect A48, wherein the separated third section has a thickness of 40 µm or less and a length of 100 m or greater.

A fiftieth aspect A50 includes the method according to any of the thirty-fifth through the forty-ninth aspects A35-A49, wherein the method further comprises conveying the first section from the first spool to a second spool.

Additional features and advantages of the laser slitting methods described herein will be set forth in the detailed description which follows, and in part will be readily apparent to those skilled in the art from that description or recognized by practicing the embodiments described herein, including the detailed description which follows, the claims, as well as the appended drawings.

It is to be understood that both the foregoing general description and the following detailed description describe various embodiment and are intended to provide an overview or framework for understanding the nature and character of the claimed subject matter. The accompanying drawings are included to provide a further understanding of the various embodiments, and are incorporated into and constitute a part of this specification. The drawings illustrate the various embodiments described herein, and together with the description serve to explain the principles and operations of the claimed subject matter.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

Reference characters indicate corresponding parts throughout the several views. The exemplifications set out herein illustrate at least one embodiment of the present disclosure, and such exemplifications are not to be construed as limiting the scope of the present disclosure in any manner.

DETAILED DESCRIPTION

Figure 1:
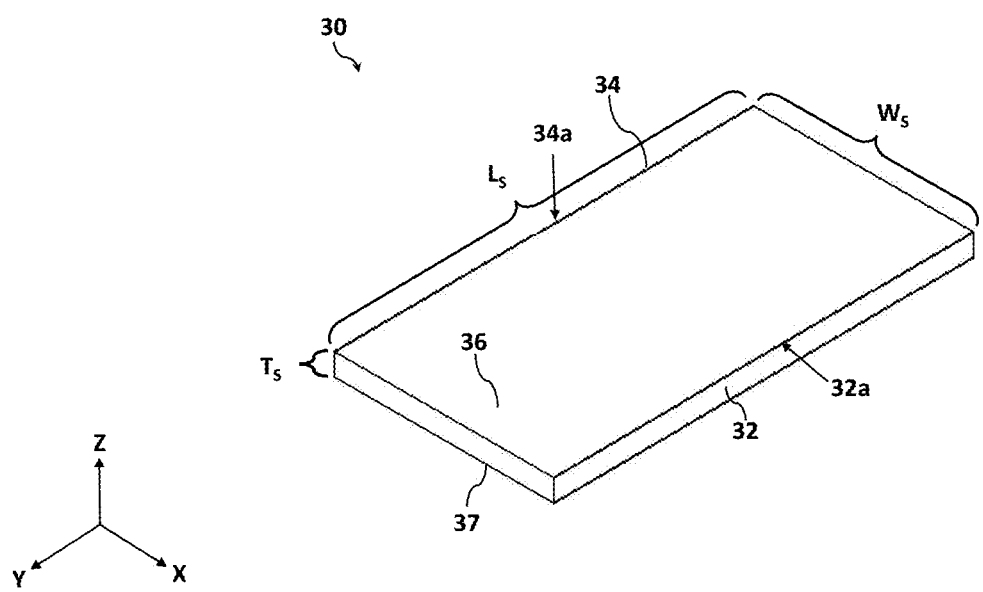
FIG. 1 is a schematic diagram illustrating an exemplary ceramic sheet, according to one or more embodiments shown and described herein.

Reference will now be made in detail to various embodiments of ceramic sheets and methods of cutting ceramic sheets. According to embodiments, a ceramic sheet may include a first surface, a second surface opposite the first surface, and a pair of parallel edges extending therebetween, a thickness of the sheet being defined as a distance between the first and second surfaces, a width of the sheet being defined as a distance between the pair of parallel edges, and a length of the sheet being defined as a dimension orthogonal to both the thickness and the width, wherein: the sheet has a thickness less than or equal to 100 µm, a length greater than or equal to 10 m, and a width less than or equal to 12 mm; and the sheet has a grain size of less than or equal to 0.2 µm and a porosity of less than or equal to 5%.

According to additional embodiments, a method of cutting a ceramic sheet, may include: conveying a ceramic sheet wound around a first spool from the first spool to a second spool, the ceramic sheet comprising a first surface, a second surface opposite the first surface, and a pair of parallel edges extending therebetween, a thickness of the ceramic sheet being defined as a distance between the first and second surfaces, a width of the ceramic sheet being defined as a distance between the pair of parallel edges, and a length of the ceramic sheet being a dimension orthogonal to both the thickness and the width, wherein: the thickness of the ceramic sheet is less than or equal to 100 µm, the length of the ceramic sheet is greater than or equal to 10 m, and the width of the ceramic sheet is greater than 12 mm; and creating a first slit in the ceramic sheet to form a first section and a second section, wherein: the first slit extends along the length of the ceramic sheet, and the first section has a thickness less than or equal to 100 µm, a length greater than or equal to 10 m, and a width less than or equal to 12 mm.

According to further embodiments still, a method of cutting a ceramic sheet may include loading a ceramic sheet wound around a first spool on a rotary stage configured to rotate the first spool about its central axis, the ceramic sheet comprising a first surface, a second surface opposite the first surface, and a pair of parallel edges extending therebetween, a thickness of the ceramic sheet being defined as a distance between the first and second surfaces, a width of the ceramic sheet being defined as a distance between the pair of parallel edges, and a length of the ceramic sheet being a dimension orthogonal to both the thickness and the width, wherein: the thickness of the ceramic sheet is less than or equal to 100 µm, the length of the ceramic sheet is greater than or equal to 10 m, and the width of the ceramic sheet is greater than 12 mm; and creating, using the cutting tool, a first slit on the ceramic sheet to form a first section and a second section, wherein: the first slit extends along the length of the ceramic sheet, and the first section has a thickness less than or equal to 100 µm, a length greater than or equal to 10 m, and a width less than or equal to 12 mm.

Various embodiments of ceramic sheets and methods of cutting ceramic sheets be described herein with specific reference to the appended drawings.

Ranges may be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

Directional terms as used herein—for example up, down, right, left, front, back, top, bottom—are made only with reference to the figures as drawn and are not intended to imply absolute orientation.

Unless otherwise expressly stated, it is in no way intended that any method set forth herein be construed as requiring that its steps be performed in a specific order, nor that with any apparatus specific orientations be required. Accordingly, where a method claim does not actually recite an order to be followed by its steps, or that any apparatus claim does not actually recite an order or orientation to individual components, or it is not otherwise specifically stated in the claims or description that the steps are to be limited to a specific order, or that a specific order or orientation to components of an apparatus is not recited, it is in no way intended that an order or orientation be inferred, in any respect. This holds for any possible non-express basis for interpretation, including: matters of logic with respect to arrangement of steps, operational flow, order of components, or orientation of components; plain meaning derived from grammatical organization or punctuation, and; the number or type of embodiments described in the specification.

As used herein, the singular forms "a," "an" and "the" include plural referents unless the context clearly dictates otherwise. Thus, for example, reference to "a" component includes aspects having two or more such components, unless the context clearly indicates otherwise.

As used herein, the term "high temperature superconductor" refers to a material that behaves as a superconductor at high temperatures (e.g., at temperatures greater than 78 K), such that the material is capable of transmitting electricity with little or no resistance loss. These high temperature superconductor materials may further provide the benefit of being cooled using liquid nitrogen.

Presently, materials that are commonly used in high temperature superconductor ("HTS") applications may have a number of shortcomings. For example, dielectric substrates that are widely used in microwave, optical, and micro-electronics may have both low dielectric constants and dissipation factors that are not suitable for HTS applications. Similarly, materials which are commonly used as radiation insulation layers in HTS applications, such as polyimide, cyanate-ester, and other organic materials, may offer insufficient radiation hardness, which may impact the conduction of a HTS device in high-radiation environments. Although the properties of ceramic may make the material a more desirable choice for HTS applications as both a substrate and radiation insulation layer as compared to conventional materials, it may be difficult to create ceramic sheets that have sufficient length, thickness, and flexibility to be implemented into HTS devices.

Disclosed herein are ceramic sheets and methods of cutting ceramic sheets that mitigate the aforementioned problems by creating long, thin, sections or ribbons of ceramic, which are capable of being used in HTS applications as both a substrate layer and an radiation insulation layer.

Ceramic Sheet

Referring now to FIG. 1 an aspect of a ceramic sheet 30 is depicted. The ceramic sheet 30 includes a first surface 36 and a second surface 37, with the first surface 36 being opposite of the second surface 37. A pair of parallel edges 32, 34 extend between the first surface 36 and the second surface 37. The pair of parallel edges 32, 34, may further include a first edge 32a and a second edge 34a, respectively. The ceramic sheet 30 may further have a thickness $T_S$, a width $W_S$, and a length $L_S$. In aspects, the ceramic sheet 30 may be configured to be composed to be used as a substrate in a HTS, while in other embodiments, the ceramic sheet may be composed to be used as a radiation insulation layer in an HTS, as will be described in additional detail herein.

As further illustrated in FIG. 1, the ceramic sheet 30 may be relatively thin (e.g., less than or equal to 100 µm, as measured in the direction of the z-axis illustrated in FIG. 1). The thickness $T_S$ is defined as a planar distance between the first surface 36 and the second surface 37. In aspects, the ceramic sheet 30 may have a thickness $T_S$ less than or equal to 100 µm, less than or equal to 50 µm, less than or equal to 25 µm or less, or even less than or equal to 10 µm. In aspects, the ceramic sheet 30 may have a thickness $T_S$ greater than or equal to 1 µm, greater than or equal to 5 µm, greater than or equal to 10 µm, greater than or equal to 20 µm, or even greater than or equal to 40 µm. In aspects, the ceramic sheet 30 may have a thickness $T_S$ greater than or equal to 1 µm and less than or equal to 100 µm, greater than 5 µm and less than 50 µm, greater than 10 µm and less than 40 µm, greater than 20 µm and less than 30 µm, or any subranges formed from any of these endpoints.

In a similar manner, the ceramic sheet 30 may be relatively long (e.g., greater than or equal to 10 m, as measured in the direction of the y-axis illustrated in FIG. 1). The length $L_S$ of the ceramic sheet 30 is defined as a dimension orthogonal to both the thickness $T_S$ and the width $W_S$. In aspects, ceramic sheet 30 may have a length $L_S$ greater than or equal to about 10 m, greater than or equal to about 25 m, greater than or equal to 50 m, or even greater than or equal to about 100 m.

The ceramic sheet 30 may also have any suitable width $W_S$ (e.g., as measured in the direction of the x-axis illustrated in FIG. 1). The width $W_S$ is defined as a distance between the pair of parallel edges 32, 34, and may be measured in the direction of the x-axis between the parallel edges 32, 34 of the ceramic sheet 30. As illustrated in FIG. 1, the parallel edges 32, 34 may extend along the length $L_S$ of the ceramic sheet 30. In aspects, the width $W_S$ of the ceramic sheet 30 may be less than or equal to 12 mm, for example, less than or equal to 10 mm, less than or equal to 8 mm, less than or equal to 6 mm, less than or equal to about 4 mm, or even less than or equal to 2 mm. For example, the ceramic sheet may have a width $W_S$ greater than or equal to 1 mm and less than or equal to 12 mm, greater than or equal to 2 mm and less than or equal to 10 mm, greater than or equal to 4 mm and less than or equal to 8 mm, or any and all subranges formed from any of these endpoints. In a particular aspect, the width $W_S$ may be greater than or equal to 1 mm and less than or equal to 10 mm.

Although the ceramic sheet 30 is illustrated as having a rectangular cross-sectional shape, in other aspects, the ceramic sheet 30 may have any suitable cross-sectional shape for the intended use. For example, in some aspects the ceramic sheet 30 may have a circular, elliptical, or irregular cross-sectional shape.

Referring still to FIG. 1, the ceramic sheet 30 may include any suitable material. For example, the ceramic sheet 30 may include zirconia, alumina, spinel, garnet, cordierite, mullite, perovskite, pyrochlore, silicon carbide, silicon nitride, boron carbide, titanium diboride, silicon alumina nitride, aluminum oxynitride, or combinations thereof. In some examples, the ceramic sheet 30 may include any of the foregoing materials with a relatively high purity (e.g., a purity of about 99% or higher), as these high purity materials may exhibit improved dielectric performance in comparison to a ceramic sheet being composed of material of lower purity. Furthermore, these high purity materials may exhibit improved corrosion resistance, higher radiation hardness, and superior flexural strength. For example, the ceramic sheet may include any of the foregoing materials or combinations thereof with a purity of about 99% or higher, about 99.5% or higher, about 99.75% or higher, about 99.9%, about 99.95% or higher, about 99.96% or higher, or about 99.99% or higher.

In some aspects, the ceramic sheet 30 may have an average grain size less than or equal to 0.2 µm. In some such aspects, the ceramic sheet 30 with a grain size of less than or equal to 0.2 µm may be denser than a ceramic sheet with a larger average grain size. In turn, the ceramic sheet 30 may exhibit improved properties in comparison to a ceramic sheet including a less dense material. For instance, the ceramic sheet 30 may exhibit improved mechanical strength in comparison to ceramic sheet with greater average grain sizes. In aspects, the ceramic sheet 30 having an average grain size of less than or equal to 0.2 µm may exhibit an average bend flexural strength of greater than 600 megapascals (MPa) when subjected to a 2 point bending strength test. In some aspects, the ceramic sheet having an average grain size of less than or equal to 0.2 µm may further exhibit a bend flexural strength of greater than or equal to 700 MPa, greater than or equal to 800 MPa, greater than or equal to 900 MPa, greater than or equal to 1000 MPa, greater than or equal to 1100 MPa, or greater than or equal to 1200 MPa. When bent between two parallel plates, one fixed and the other movable using a stepper motor, the ceramic material deforms to an elliptic shape with variable radius of curvature, thereby experiencing bending stresses with maxima at the mid-length and minima at contact lines with parallel plates. In aspects, the ceramic sheet 30 may further exhibit a bending radius of greater than or equal to 2.5 mm.

Referring still to FIG. 1, the ceramic sheet 30 may exhibit a variety of additional properties. In aspects, the ceramic sheet 30 may have a porosity less than or equal to 5% by volume. In other aspects, the ceramic sheet 30 may have a porosity of less than or equal to 0.5% by volume. For example, the ceramic sheet may have a porosity less than or equal to 4.5% by volume, less than or equal to 4% by volume, less than or equal to 3.5% by volume, less than or equal to 3% by volume, less than or equal to 2.5% by volume, less than or equal to 2% by volume, less than or equal to 1.5% by volume, less than or equal to 1% by volume or any and all subranges formed any of these endpoints.

Similarly, the ceramic sheet 30 may have a tensile strength greater than or equal to 400 MPa, greater than or equal to 500 MPa, or greater than or equal to 600 MPa. For example, the ceramic sheet may have a tensile strength greater than or equal to 400 MPa and less than or equal to 600 MPa, greater than or equal to 400 MPa and less than or equal to 500 MPa, or even greater than or equal to 500 MPa and less than or equal to 600 MPa, or any and all subranges formed from any of these endpoints. In these aspects, the tensile strength of the ceramic sheet 30 may be measure by determining the peak tension force the ceramic sheet is able to withstand and dividing the peak tension force by the cross-sectional area of the ceramic sheet 30.

In aspects, the ceramic sheet 30 may have a radiation resistance greater than or equal to 50 MGy, In aspects, the ceramics sheet 30 may have an inductance less than or equal to 0.1 mH. In aspects, the ceramic sheet 30 may have a thermal conductivity greater than or equal to 1 w/mK. It should be noted that many superconducting magnets utilize organic materials having low thermal conductivity, which may negatively affect the conduction of a cooling magnet in a high-radiation environment by inhibiting heat transfer from the superconductor to the cooling magnet. Thus, a ceramic sheet 30 having the thermal conductivity described herein may be necessary for implementation in a HTS application. In aspects, the ceramic sheet may have a resistivity greater than or equal to $5 \times 10^{-5}$ Ω-cm. In other aspects, the ceramic sheet 30 may have an oxidation resistance of greater than or equal to 1000° C.

In other aspects still, the ceramic sheet 30 may be chemically inert to rare-earth barium copper oxide ("RE-BCO") in a high temperature superconductor environment. Notably, REBCO coated tapes may be desirable for use in HTS applications due to the high magnetic field generated by the material. By ensuring that the ceramic sheet 30 is chemically inert to REBCO, the material may be deposited on the ceramic sheet 30 such that the ceramic sheet 30 may similarly generate a high magnetic field.

Figure 2:
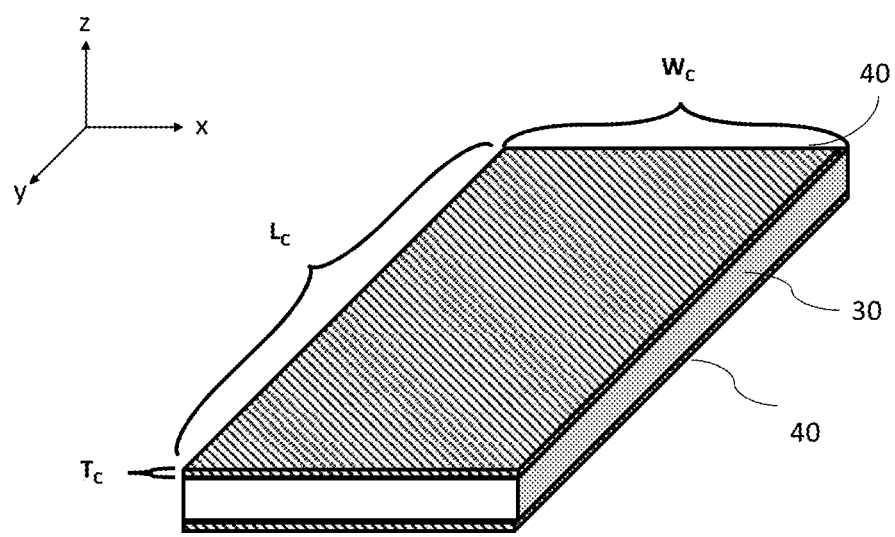
FIG. 2 is a schematic diagram illustrating a the ceramic sheet of FIG. 1 with a coating layer, according to one or more embodiments shown and described herein.

Turning now to FIG. 2, the ceramic sheet 30 may further include a coating layer 40. In aspects, the coating layer 40 may be applied on the first surface 36, the second surface 37, or on both the first and second surfaces 36, 37. The ceramic sheet illustrated in FIG. 2 depicts the ceramic sheet 30 having the coating layer 40 deposited on both the first surface 36 and the second surface 37. In further aspects, the coating layer 40 may include a first coating layer, and additional coating layers, such as a second coating layer and a third coating layer, may be applied on the first coating layer. In further aspects, the first coating layer may be disposed on the first and/or second surface 36, 37 of the ceramic sheet, the second coating layer may be disposed on the first coating layer, and the third coating layer may be disposed on the second coating layer, as will be described in additional detail herein.

Further still, in further aspects, the coating layers applied on the first surface 37 of the ceramic sheet 30 may mirror the coating layers applied on the second surface 37 of the ceramic sheet. For example, the same number of coating layers may be applied on each surface (e.g., each of the first and second surfaces 36, 37 may include a first coating layer, a first and second coating layer, or a first, second, and third coating layer.) The method by which the coating layers are deposited on the ceramic sheet will also be described in more detail herein.

In further aspects, the coating layer 40 may have a thickness $T_C$, a width $W_C$, and a length $L_C$. In further aspects, the width $W_C$ and the length $L_C$ of the coating layer 40 may be equal to the width $W_S$ and length $L_S$ of the ceramic sheet 30, such that the coating layer 40 covers the entire surface area of the ceramic sheet 30. However, in other aspects, the coating layer 40 may have alternate dimensions, such that only a portion of the ceramic sheet 30 is covered by the coating layer 40. In the aspects described herein, the coating layer 40 may comprise nickel, yttria-stabilized zirconia, alumina, cerium oxide, magnesium oxide, titanium, copper, or combinations thereof.

Referring still to FIG. 2, the coating layer 40 may be relatively thin (e.g., less than or equal to 500 nm, as measured in the direction of the z-axis illustrated in FIG. 2). In aspects, the coating layer 40 may have a thickness greater than or equal to 100 nm. In some such aspects, the coating layer 40 may have a thickness $T_c$ of less than or equal to 500 nm, less than or equal to 450 nm, less than or equal to 400 nm, less than or equal to 350 nm, less than or equal to 300 nm, less than or equal to 250 nm, less than or equal to 200 nm, or less than or equal to 150 nm. For example, the coating layer 40 may have a thickness $T_c$ greater than or equal to 100 nm and less than or equal to 500 nm, greater than or equal to 150 nm and less than or equal to 450 nm, greater than or equal to 200 nm and less than or equal to 400 nm, greater than or equal to 250 nm and less than or equal to 350 nm, or any and all subranges formed from any of these endpoints.

Cutting a Ceramic Sheet

Figure 3A:
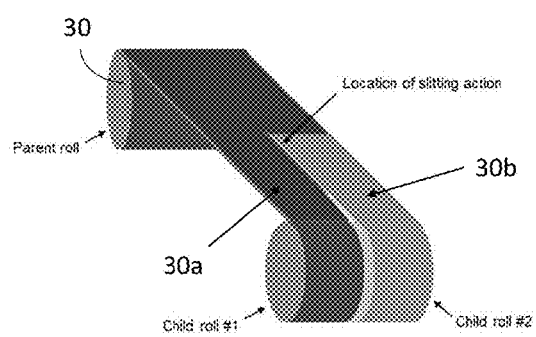
FIG. 3A schematically depicts a process of slitting the ceramic sheet of FIG. 1, according to one or more embodiments shown and described herein.

Turning now to FIG. 3A, in order to effectively utilize the ceramic sheet 30, for example, in a HTS application, the ceramic sheet 30 may be cut into a plurality of sections, or ribbons, by continuously cutting, or ripping, the ceramic sheet 30 in the width $W_S$ direction. In aspects, the process of cutting the ceramic sheet 30 into a plurality of sections may be referred to as slitting.

Figure 3B:
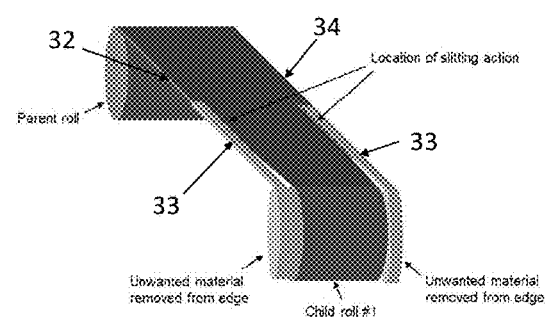
FIG. 3B schematically depicts a process of removing edge material from the ceramic sheet of FIG. 1, according to one or more embodiments shown and described herein.

Prior to slitting the ceramic sheet 30, the ceramic sheet 30 may be wound into a roll, such that the ceramic sheet 30 may be cut as the ceramic sheet 30 is unwound. In aspects, slitting may be used to separate the ceramic sheet 30 into a first section 30a and a second section 30b, as illustrated in FIG. 3A. Additionally, slitting may further serve to remove edge material 33 from the ceramic sheet 30, as illustrated in FIG. 3B. In further aspects, edge material 33 may be removed from one or both of the parallel edges 32, 34.

The process of cutting the ceramic sheet 30 may be performed using various methods of slitting. For example, the ceramic sheet 30 may be cut using a roll-to-roll method of slitting or an on-spool method of slitting (both of which are discussed below).

Roll-to-Roll Method

Figure 4:
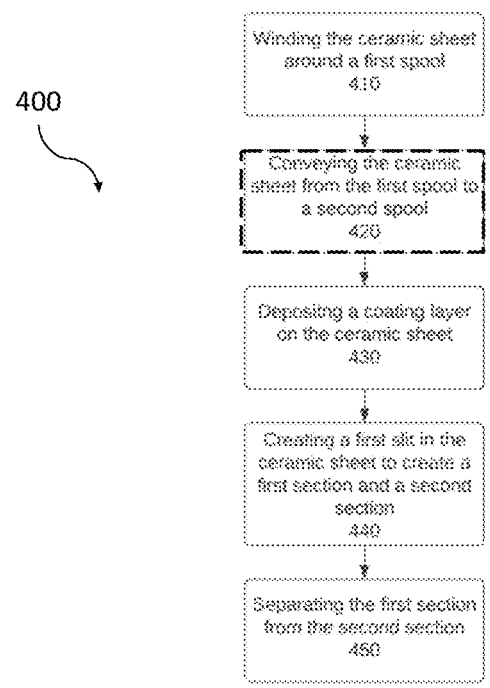
FIG. 4 depicts an illustrative flow diagram of a method of cutting a ceramic sheet utilizing a roll-to-roll method of slitting, according to one or more embodiments shown and described herein.
Figure 5A:
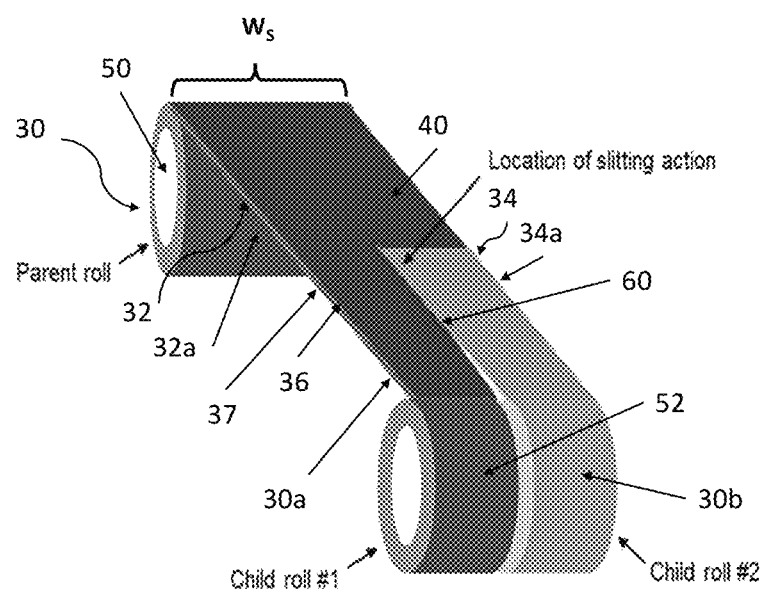
FIG. 5A schematically depicts a roll-to-roll conveyance mechanism for performing the method of FIG. 4, according to one or more embodiments described herein.

FIG. 4 depicts a method 400 of cutting a ceramic sheet 30 utilizing a roll-to-roll method, such as a continuous roll-to-roll method. As depicted at block 410, the method may optionally begin by winding the ceramic sheet 30 around a first spool 50, as shown in FIG. 5A. Once the ceramic sheet is wound around the first spool 50, the method 400 may proceed to block 420, which may involve conveying the ceramic sheet 30 from the first spool 50 to a second spool 52. It should be understood that the ceramic sheet 30 described herein may include the same dimensions and properties as the ceramic sheet depicted in FIG. 1.

Figure 5B:
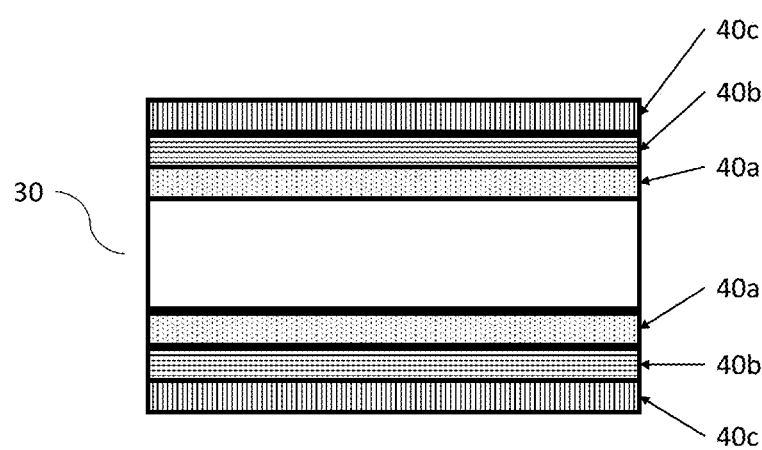
FIG. 5B schematically depicts a front side view of the ceramic sheet with a coating layer, according to one or more embodiments shown and described herein.

Referring now to FIGS. 4, 5A, and 5B, as the ceramic sheet 30 is conveyed from the first spool 50 to the second spool 52, the method may move to block 430, which may involve depositing a first coating layer 40a on the ceramic sheet 30. In some aspects, the method step of block 430 may involve depositing the first coating layer 40a on a first surface 36 or a second surface 37 of the ceramic sheet 30.

In aspects, the first coating layer 40a may extend along the entire length L s of the ceramic sheet 30. Furthermore, the first coating layer 40a may include nickel, yttria-stabilized zirconia, alumina, cerium oxide, magnesium oxide, titanium, copper, or combinations thereof.

Referring now to FIGS. 4 and 5B, the method step of depositing a coating layer on the ceramic sheet 30 may further involve depositing a second coating layer 40b on the first coating layer 40a deposited on the ceramic sheet 30. Further still, the method step of depositing a coating layer on the ceramic sheet may involve depositing a third coating layer 40c on the second coating layer 40b deposited on the first coating layer 40a deposited on the ceramic sheet 30. In aspects, the second coating layer 40b and/or the third coating layer 40c may extend along the entire length $L_s$ of the ceramic sheet 30. Furthermore, it should be understood that the second coating layer 40b and third coating layer 40c may be deposited on the first and/or second surfaces 36, 37 of the ceramic sheet 30.

As most clearly depicted in FIG. 5B, the coating layers 40a, 40b, 40c deposited on the first surface 36 of the ceramic sheet 30 may mirror the coating layers 40a, 40b, 40c deposited on the second surface of the ceramic sheet 30. In aspects, the first surface 36 of the ceramic sheet 30 and the second surface 37 of the ceramic sheet 30 may include the same number of coating layers 40a, 40b, 40c (e.g., one, two, or three coating layers). However, one skilled in the art would understand that, in some aspects, the first and/or second surfaces 36, 37 of the ceramic sheet 30 may not include coating layers 40a, 40b, 40c. For example, in such aspects, only one of the first or second surfaces 36, 37 of the ceramic sheet may include any of the first, second, or third coating layers 40a, 40b, 40c.

The materials used for the first, second, and third coating layers 40a, 40b, 40c may be dependent on the intended application of the ceramic sheet 30. As has been described herein, the ceramic sheet 30 may be utilized as either a substrate or a radiation insulation layer in a HTS. As can be appreciated, the materials of the first, second, and third coating layers 40a, 40b, 40c may vary depending on the intended use of the ceramic sheet 30.

For example, in aspects in which the ceramic sheet may be used as a substrate in a HTS, the first coating layer 40a may include yttria-stabilized zirconia, alumina, cerium oxide, magnesium oxide, or combinations thereof. Similarly, the second coating layer 40b may be disposed on the first coating layer 40a and may include alumina, yttrium oxide, yttria-stabilized zirconia, cerium oxide, magnesium oxide, lanthanum manganite, or combinations thereof. In these aspects, the third coating layer 40c may be disposed on the second coating layer 40b and may include rare-earth barium copper oxide. As may be appreciate by those skilled in the art, REBCO may refer to a family of chemical compounds which are known for exhibiting high temperature superconductivity. These REBCO compounds may sustain stronger magnetic fields than alternative superconductor materials, and may allow for the adoption of more compact and efficient HTS devices. In view of the foregoing, it should be understood that the third coating layer 40c (e.g., the REBCO coating layer) may act as the HTS in aspects in which the ceramic sheet 30 is to be used as a HTS substrate.

In aspects in which the ceramic sheet 30 is utilized as a HTS substrate, the coating layer 40 may be applied to the ceramic sheet using a solution deposition planarization technique. For example, solution deposition planarization may be utilized in instances when the surface roughness of the coating layer 40 exceeds a predetermined threshold. As provided herein, the term surface roughness may refer the average surface roughness of the coating layer 40, and may be measured by calculating the average surface heights and depths of the coating layer 40 across the entire surface of the coating layer 40. In some aspects, the planarization technique may be applied when the average surface roughness of the coating layer is greater than or equal to 20 nm, greater than or equal to 10 nm, greater than or equal to 5 nm, or greater than or equal to 1 nm.

Referring still to FIG. 5B, in other aspects, the ceramic sheet 30 may be used as a radiation-hard insulation layer in a HTS. In these aspects, the first coating layer 40a may include titanium, nickel, copper, or combinations thereof. The second coating layer 40b may be disposed on the first coating layer 40a and may include titanium, nickel, copper, or combinations thereof. Furthermore, the third coating layer 40c may be disposed on the second coating layer 40b and may include a high-temperature superconductivity tape. As provided herein, the term "high-temperature superconductivity tape" may be defined as a tape which conducts electricity with zero electrical resistance and may be manufactured in relatively long (e.g., greater than or equal to 10 m), flexible lengths. The tape may further be formed into magnetic coils for the purpose of generating large magnetic fields in a HTS application.

In aspects in which the ceramic sheet 30 is utilized as a radiation radiation insulation layer in a HTS application, the coating layer 40 may be deposited on the ceramic sheet using, for example, a sputtering ore-beam deposition process. As described herein, the sputtering ore-beam deposition process may involve focusing an ion beam on the ceramic sheet 30 and sputtering the coating layer 40 onto the ceramic sheet 30. The sputtering ore-beam deposition process may help achieve the densest and most high quality coating layer 40 on the ceramic sheet 30.

With the coating layer 40 deposited on the ceramic sheet 30, the method may move to block 440, which may involve creating a first slit 60 in the ceramic sheet 30 to create a first section 30a and a second section 30b, as is most clearly illustrated in FIG. 5A. In aspects, the first slit 60 may extend along the length $L_s$ of the ceramic sheet 30, such that the first section 30a has a length that is less than or equal to the length $L_s$ of the ceramic sheet. In these aspects, the first section 30a may further include a width which is less than the width W s of the ceramic sheet 30. For example, as depicted in FIG. 5A, the first slit 60 may be positioned such that the width of the first section 30a is half the width $W_s$ of the ceramic sheet 30. Similarly, the first slit 60 may be positioned such that the width of the first section 30a is one quarter of the width $W_s$ of the ceramic sheet 30. Similarly, the first section 30a may include a thickness that is less than or equal to the thickness $T_s$ of the ceramic sheet. In aspects, the first section 30a may have a thickness that is greater than or equal to 1 μm and less than or equal to 100 μm, greater than or equal to 10 μm and less than or equal to 50 μm, greater than or equal to 20 μm and less than or equal to 40 μm, or any and all subranges formed from any of these endpoints. In a particular aspect, the first section 30a may have a thickness less than or equal to 100 μm, a length greater than or equal to 10 m, and a width less than or equal to 12 mm.

Referring back to FIG. 4, the step of creating the slit in block 440 may further include a cutting step. In aspects, the cutting step may consist of non-diffracting beam processing, laser ablation, carbon monoxide crack propagation, dice sawing, diamond wire sawing, water jetting, scribing and breaking, or combinations thereof, to create the first slit 60.

In aspects, the various cutting processes described herein may provide various benefits. For example, non-diffracting beam processing may include filamentation and other forms of beam cutting, and may provide the ability to cut through multiple layers of the ceramic sheet simultaneously.

In aspects, laser ablation may further include femtosecond, picosecond, and nanosecond ablation, and may be conducted at a plurality of different wavelengths including 1064 nm, 532 nm, 355 nm, or 10.6 μm depending on the material being ablated.

In some aspects, carbon monoxide crack propagation processes may include flaw initiated and propagated processes which utilize thermal stress driven by a carbon monoxide or carbon dioxide laser to create the first slit 60 during the cutting step. These processes may be conducted at high speeds, and may offer the advantage of achieving high edge strengths in the first section 30a and second section 30b where the first slit 60 is created.

As previously discussed, the cutting step may be conducted using a dicing saw or a diamond wire saw. The dicing saw may provide a low cost solution for conducting the cutting step, while further allowing for multiple dicing saws to be positioned along the first spool 50, such that multiple slits may be created and cut simultaneously. In aspects in which a diamond wire saw is utilized, the reciprocating action of the saw may carry waste material away from the first spool 50 and allow the waste material to be managed at a location away from the first spool 50 (e.g., in a coolant bath).

In other aspects, a water jet or a scribe and break process may be employed to conduct the cutting step. Although each of these processes offer lower edge strengths in comparison to a laser ablation method, the water jet and scribe and break approaches offer highly cost effective solutions for completing the cutting step.

Referring again to FIGS. 4 and 5A, the first slit 60 may be made at various locations along the width $W_s$ of the ceramic sheet 30. For example, the first slit 60 may be formed at least 1 mm from the first edge 32a of parallel edge 32 in a direction towards the second edge 34a of parallel edge 34. In other aspects, the first slit 60 may be formed at least 5 mm from the first edge 32a of parallel edge 32 in a direction towards the second edge 34a of parallel edge 34. Further still, in aspects the first slit 60 may be formed greater than 1 mm and less than 5 mm, greater than 2 mm or less than 4 mm, or any and all subranges from any of these endpoints, from the first edge 32a. In aspects, the width of the first section may be equal to the distance of the first slit 60 from the first edge 32a. Although specific aspects have been described herein, it should be understood that the first slit 60 may be created at any point along the width $W_s$ of the ceramic sheet 30.

Once the first slit 60 has been formed, the method may proceed to block 450, which may involve separating the first section 30a from the second section 30b. In these aspects, the first section 30a may be separated from the second section 30b about the first slit 60. For example, in some aspects, the first section 30a may be separated from the second section 30b by applying a mechanical stress along the first slit 60. In other aspects, the first section 30a may be separated from the second section 30b by applying thermal stress along the first slit 60.

In some aspects, the method steps of creating a first slit 60 in the ceramic sheet 30 and separating the first section 30a from the second section 30b may be repeated to create a plurality of sections of ceramic sheet 30. For example, once the first section 30a is separated from the second section 30b, a second slit may be formed in the ceramic sheet 30, such that a third section is formed. The third section may be separated from the second section using the separating methods described herein, and the method may be repeated again until the desired number of sections have been created or the entire width $W_s$ of the ceramic sheet 30 has been utilized.

Figure 5C:
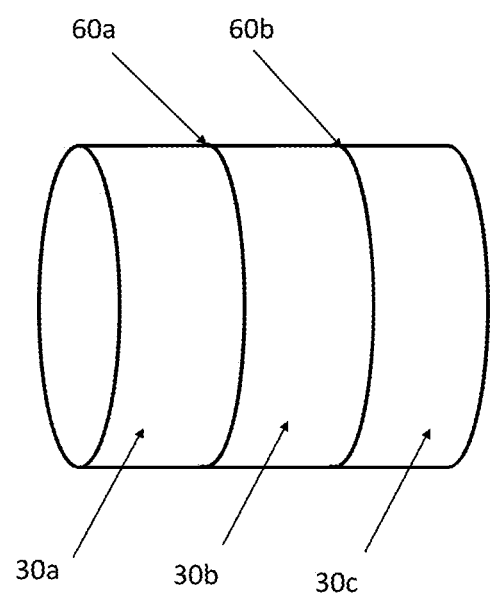
FIG. 5C schematically depicts a step in the ceramic sheet cutting method of FIG. 4, according to one or more embodiments shown and described herein.

It should be further understood that the method step of slitting the ceramic sheet 30 may be fully completed prior to separating any of the plurality of sections of the ceramic sheet 30, as is depicted in FIG. 5C. For example, a plurality of slits may be created in the ceramic sheet 30 before any of the sections are separated from their adjacent sections. In these aspects, a first slit 60a and second slit 60b may formed on the ceramic sheet 30, such that a first section 30a, a second section 30b, and a third section 30c is formed. Once the slits are created, each of the first section 30a, the second section 30b, and the third section 30c may be separated from their adjacent sections simultaneously.

Referring again to FIG. 4, although the method step of depositing a coating layer 40 at block 430 on the ceramic sheet 30 is illustrated as occurring prior to the method step of creating a first slit 60 in the ceramic sheet 30 at block 440, it should be understood that, in some aspects, these method steps may occur in a different order. For example, the method step of creating a first slit 60 in the ceramic sheet 30 may occur prior to depositing a coating layer 40 on the ceramic sheet 30. Although the method step of creating the first slit 60 in the ceramic sheet 30 may be conducted either before or after depositing the coating layer 40 on the ceramic sheet 30, it may be advantageous to apply the coating layer 40 to the ceramic sheet prior to creating the first slit 60 in order to minimize costs. For example, the process of depositing a coating layer 40 on a single ceramic sheet 30 may be simpler and more cost effective than depositing a coating layer 40 on a ceramic sheet 30 that has been slit into a plurality of sections (e.g., first section 30a, second section 30b, etc.). Furthermore, the method step of separating the first section 30a and the second section 30b of the ceramic sheet may similarly occur prior to the method step of depositing a coating layer 40 on the ceramic sheet 30.

On-Roll Method

Figure 6:
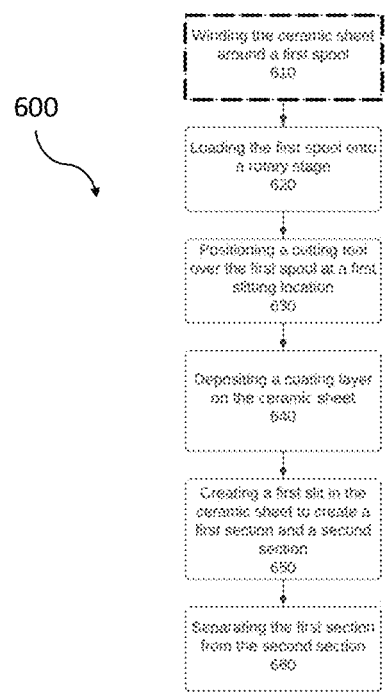
FIG. 6 depicts an illustrative flow diagram of a method of cutting a ceramic sheet utilizing a spool slitting method of slitting, according to one or more embodiments shown and described herein.
Figure 7A:
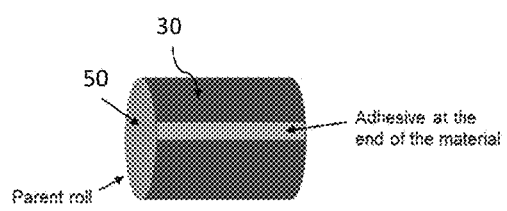
FIG. 7A schematically depicts a step of the ceramic sheet cutting method of FIG. 6, according to one or more embodiments shown and described herein.

Turning now to FIG. 6, a method 600 of cutting a ceramic sheet 30 utilizing an on-roll method is depicted. As depicted at block 610, the method may optionally begin by winding the ceramic sheet 30 around a first spool 50, as shown in FIG. 7A. In aspects, an adhesive material may be applied to the end of the ceramic sheet 30 to ensure that the first spool 50 does not become unintentionally unraveled.

Figure 7B:
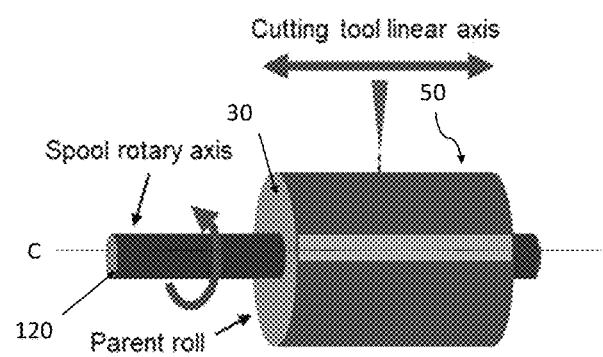
FIG. 7B schematically depicts another step of the ceramic sheet cutting method of FIG. 6, according to one or more embodiments shown and described herein.

Once the ceramic sheet is wound around the first spool 50, the method 600 may proceed to block 620, which may involve loading the first spool 50 onto a rotary stage 120. In these aspects, the rotary stage 120 may be configured to rotate the first spool 50 about its central axis C in either a clockwise or counterclockwise direction RD, as most clearly illustrated in FIG. 7B. It should be understood that the ceramic sheet 30 described herein may include the same dimensions and properties as the ceramic sheet depicted in FIG. 1.

Figure 8:
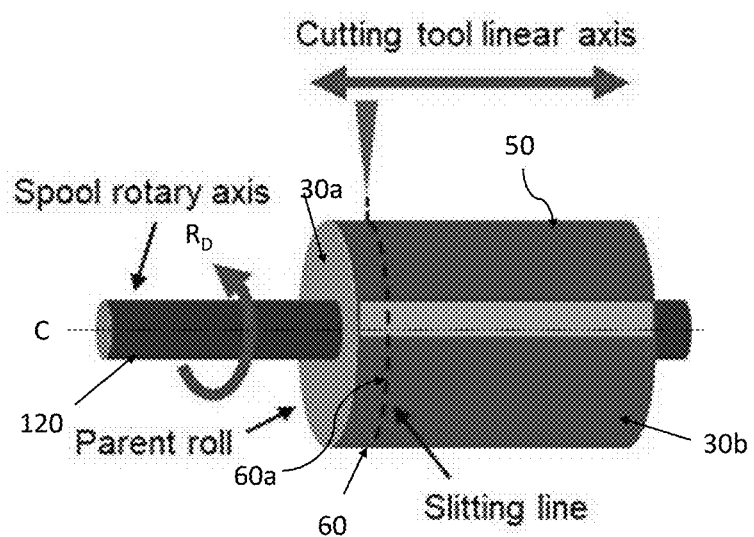
FIG. 8 schematically depicts another step of the ceramic sheet cutting method of FIG. 6, according to one or more embodiments shown and described herein.

After the first spool 50 has been loaded on the rotary stage 120, the method 600 may move to block 630, in which a cutting tool may be positioned over the first spool 50 at a first slitting location, as is depicted in FIG. 8. In these aspects, the cutting tool may be a singular cutting tool which is mounted on an axis parallel to the central axis C of the first spool 50, such that the cutting tool may traverse the entire width W s of the ceramic sheet 30 wound about the first spool 50.

Referring again to FIG. 6, once the cutting tool has been positioned at a first slitting location 60a, the method may move to block 640, which may include depositing a coating layer 40 on the ceramic sheet 30. More specifically, a first coating layer 40 may be deposited on the ceramic sheet 30. In aspects, the first coating layer 40a may extend along the entire length Ls, and may be deposited on the first and/or second surfaces 36, 37 of the ceramic sheet 30.

Additionally, it should be understood that the coating layer 40 materials utilized at block 430 of the method 400 depicted in FIG. 4 may similarly be used at block 640 of the method 600 depicted in FIG. 6. For example, the materials used for the coating layer 40 may similarly be dependent on the intended application of the ceramic sheet 30 (e.g., substrate application or radiation insulation layer application).

Referring again to FIG. 6, it should be further understood that the method step of depositing a coating layer 40 on the ceramic sheet may further involve depositing a second coating layer 40b on the first coating layer 40a deposited on the ceramic sheet 30. Further still, the method step of depositing a coating layer 40 on the ceramic sheet 30 may involve depositing a third coating layer 40c on the second coating layer 40b deposited on the first coating layer 40a deposited on the ceramic sheet 30. In these aspects, the second coating layer 40b and/or the third coating layer 40c may extend along the entire length L s of the ceramic sheet 30. Furthermore, it should be understood that the second coating layer 40b and/or the third coating layer 40c may be deposited on the first and/or second surfaces 36, 37 of the ceramic sheet 30.

With the coating layer 40 deposited on the ceramic sheet 30, the method may move to block 650, which may involve creating a first slit 60 in the ceramic sheet 30 at the first slitting location 60a using the cutting tool to create a first section 30a and a second section 30b, as is most clearly illustrated in FIG. 8. In these aspects, the first spool 50 is rotated about its central axis C by the rotary stage 120 such that the first slit 60 is created about the entire circumference of the first spool 50. Depending on the cutting tool used to create the first slit 60, it should be noted that multiple rotations of the first spool 50 may be conducted in order to create the first slit 60 through multiple layers of the ceramic sheet 30.

In these aspects, the first slit 60 may extend along the length L s of the ceramic sheet 30, such that the first section 30a has a length that is less than or equal to the length L s of the ceramic sheet. In these aspects, the first section 30a may further include a width which is less than the width $W_s$ of the ceramic sheet 30. For example, the first slit 60 may be created at least 1 mm from the first edge 32a of parallel edge 32 in a direction towards the second edge 34a of parallel edge 34. In other aspects, the first slit 60 may be created at least 5 mm from the first edge 32a of parallel edge 32 in a direction towards the second edge 34a of parallel edge 34. Further still, the first slit 60 may be created greater than 1 mm and less than 5 mm, greater than 2 mm or less than 4 mm, or any and all subranges formed from these endpoints, from the first edge 32a. In these aspects, the width of the first section may be equal to the distance of the first slit 60 from the first edge 32a. Although specific aspects have been described herein, it should be understood that the first slit 60 may be created at any point along the width W s of the ceramic sheet 30.

Similarly, the first section 30a may include a thickness which is less than or equal to the thickness $T_s$ of the ceramic sheet. For example, the first section 30a may have a thickness greater than or equal to 1 µm and less than or equal to 100 µm, greater than or equal to 5 µm and less than or equal to 50 µm, greater than or equal to 10 µm and less than or equal to 40 µm, greater than or equal to 20 µm and less than or equal to 30 µm or any and all subranges formed from any of these endpoints. In a particular aspect, the first section 30a may have a thickness less than or equal to 100 µm, a length greater than or equal to 10 m, and a width less than or equal to 12 mm.

As discussed previously herein, the slitting step may further include creating the first slit 60 using the cutting tool. In these aspects, the cutting tool may consist of any device capable of performing non-diffracting beam processing, laser ablation, carbon monoxide crack propagation, dice sawing, diamond wire sawing, water jetting, scribing and breaking, or combinations thereof, to create the first slit 60.

Once the first slit 60 has been formed, the method may proceed to block 660, which may involve separating the first section 30a from the second section 30b. In these aspects, the first section 30a may be separated from the second section 30b about the first slit 60. For example, in some aspects, the first section 30a may be separated from the second section 30b by applying a mechanical stress along the first slit 60. In other aspects, the first section 30a may be separated from the second section 30b by applying thermal stress along the first slit 60.

In some aspects, the method steps of creating a first slit 60 in the ceramic sheet 30 and separating the first section 30a from the second section 30b may be repeated to create a plurality of sections of ceramic sheet 30. For example, once the first section 30a is separated from the second section 30b, a second slit may be formed in the ceramic sheet 30, such that a third section is formed. The third section may be separated from the second section using the separating methods described herein, and the method may be repeated again until the desired number of sections have been created or the entire width $W_s$ of the ceramic sheet 30 has been utilized.

In these aspects, the second slit (and any additional subsequent slits) may be created my indexing the cutting tool along the width $W_s$ of the ceramic sheet 30. As has been described herein, the cutting tool may be continually indexed along the entire width $W_s$ of the ceramic sheet 30 or until the desired number of sections have been created. In other aspects, the cutting tool may remain fixed in place, and the first spool 50 may be indexed such that the cutting tool aligns with a new slit location. The first spool 50 may be continually indexed until the entire width $W_s$ of the ceramic sheet 30 has been treated by the cutting tool.

It should be further understood that the method step of slitting the ceramic sheet 30 may be fully completed prior to separating any of the plurality of sections of the ceramic sheet 30. For example, a plurality of slits may be created in the ceramic sheet 30 before any of the sections are separated from their adjacent sections. In these aspects, a first slit and second slit may formed on the ceramic sheet 30, such that a first section, a second section, and a third section is formed. Once the slits are created, each of the first section, the second section, and the third section may be separated from their adjacent sections simultaneously.

Referring again to FIG. 6, although the method step of depositing a coating layer 40 at block 430 on the ceramic sheet 30 is illustrated as occurring prior to the method step of creating a first slit 60 in the ceramic sheet 30 at block 650, it should be understood that, in some aspects, these method steps may occur in a different order. For example, the method step of creating a first slit 60 in the ceramic sheet 30 may occur prior to depositing a coating layer 40 on the ceramic sheet 30. Furthermore, the method step of separating the first section 30a and the second section 30b of the ceramic sheet may similarly occur prior to the method step of depositing a coating layer 40 on the ceramic sheet 30.

Figure 9:
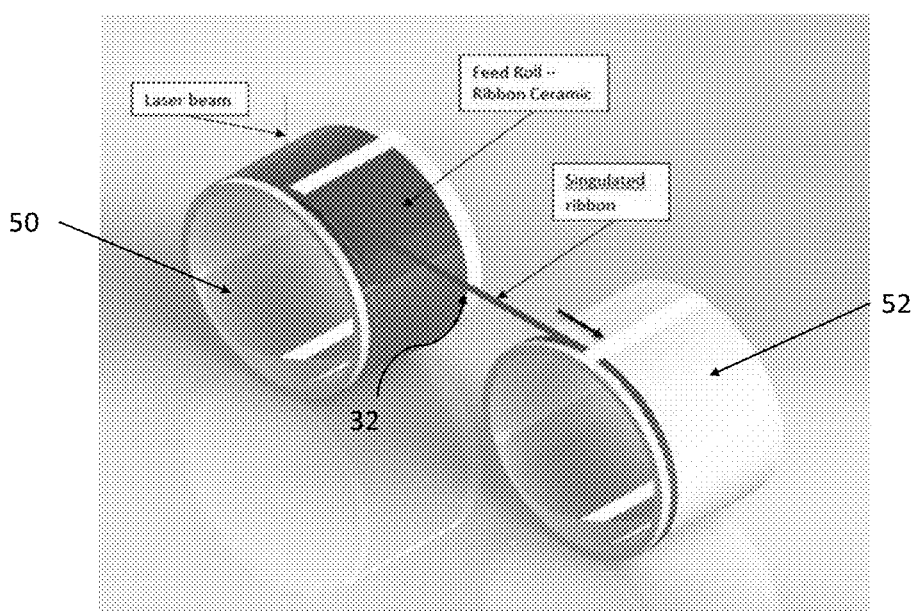
FIG. 9 schematically depicts another step of the ceramic sheet cutting method of FIG. 6, according to one or more embodiments shown and described herein.

Referring still to FIG. 6, in some aspects, the method 600 may further include a step of conveying the first section 30a (and any additional sections) from the first spool 50 to a second spool 52, as is depicted in FIG. 9. In these aspects, the first section 30a of the first spool 50 is conveyed to a second spool 52 as the first spool 50 is being slit. This aspect may be advantageous to allow the cutting tool to consistently cut through the desired number of sections on the first spool 50. As the first spool 50 is rotated by the rotary stage 120, the surface layers of the ceramic sheet may be transferred to the second spool 52 while the cutting tool may continue to cut through deeper layers of the ceramic sheet 30.

As should be appreciated in view of the foregoing, a ceramic sheet and a method of cutting a ceramic sheet are disclosed herein. Specifically, the sheets and methods described herein may allow for the creation of long and thin sections of ceramic which are capable of being used in HTS applications as both a substrate layer and an radiation insulation layer It will be apparent to those skilled in the art that various modifications and variations may be made to the aspects described herein without departing from the spirit and scope of the claimed subject matter. Thus, it is intended that the specification cover the modifications and variations of the various aspects described herein provided such modification and variations come within the scope of the appended claims and their equivalents.

What is claimed is:

1. A method of cutting a ceramic sheet, the method comprising:
   conveying a ceramic sheet wound around a first spool from the first spool to a second spool, the ceramic sheet comprising a first surface, a second surface opposite the first surface, and a pair of parallel edges extending therebetween, a thickness of the ceramic sheet being defined as a distance between the first and second surfaces, a width of the ceramic sheet being defined as a distance between the pair of parallel edges, and a length of the ceramic sheet being a dimension orthogonal to both the thickness and the width, wherein the thickness of the ceramic sheet is less than or equal to 100 µm, the length of the ceramic sheet is greater than or equal to 10 m, and the width of the ceramic sheet is greater than 12 mm; and
   creating a first slit in the ceramic sheet to form a first section and a second section, wherein:
      the first slit extends along the length of the ceramic sheet, and
      the first section has a thickness less than or equal to 100 µm, a length greater than or equal to 10 m, and a width less than or equal to 12 mm.

2. The method of claim 1, further comprising depositing a first coating layer on the ceramic sheet that extends along the length of the ceramic sheet, wherein the first coating layer comprises nickel, yttria-stabilized zirconia, alumina, cerium oxide, magnesium oxide, titanium, copper, or combinations thereof.

3. The method of claim 2, wherein the method further comprises depositing a second coating layer on the first coating layer deposited on the ceramic sheet that extends along the length of the ceramic sheet, the second coating layer comprising alumina, yttrium oxide, yttria-stabilized zirconia, cerium oxide, magnesium oxide, lanthanum manganite, or combinations thereof.

4. The method of claim 3, wherein the method further comprises depositing a third coating layer on the second coating layer that extends along the length of the ceramic sheet, the third coating layer comprising rare-earth barium copper oxide.

5. The method of claim 2, wherein the method further comprises:
   depositing a second coating layer on the first coating layer deposited on the ceramic sheet that extends along the length of the ceramic sheet, the second coating layer comprising titanium, nickel, copper, or combinations thereof; and
   depositing a third coating layer on top of the second coating layer deposited on the first coating layer of the ceramic sheet, the third coating layer comprising a high-temperature superconductivity tape.

6. A method of cutting a ceramic sheet, comprising the steps of:
   loading a ceramic sheet wound around a first spool on a rotary stage configured to rotate the first spool about its central axis, the ceramic sheet comprising a first surface, a second surface opposite the first surface, and a pair of parallel edges extending therebetween, a thickness of the ceramic sheet being defined as a distance between the first and second surfaces, a width of the ceramic sheet being defined as a distance between the pair of parallel edges, and a length of the ceramic sheet being a dimension orthogonal to both the thickness and the width, wherein:
      the thickness of the ceramic sheet is less than or equal to 100 µm, the length of the ceramic sheet is greater than or equal to 10 m, and the width of the ceramic sheet is greater than 12 mm; and
   creating, using the cutting tool, a first slit on the ceramic sheet to form a first section and a second section, wherein:
      the first slit extends along the length of the ceramic sheet, and
      the first section has a thickness less than or equal to 100 µm, a length greater than or equal to 10 m, and a width less than or equal to 12 mm.

7. The method of claim 6, wherein the pair of parallel edges of the ceramic sheet comprise a first edge and a second edge, and the first slit is less than or equal to 5 mm from the first edge in a direction toward the second edge.

8. The method of claim 1, further comprising:
   positioning the first spool on a rotary stage configured to rotate the first spool about its central axis; and
   positioning a cutting tool over the first spool at a first slitting location, wherein the cutting tool forms the first slit in the ceramic sheet.

9. The method of claim 8, further comprising:
   positioning a second cutting tool over the first spool at a second slitting location and creating a second slit on the ceramic sheet to form the second section and a third section, wherein:
      the second slit extends along the length of the ceramic sheet, and
      the third section has a thickness of 40 µm or less and a length of 100 m or more.

10. The method of claim 1, wherein the ceramic sheet has a radiation resistance greater than or equal to 50 MGy, an inductance less than or equal to 0.1 mH, a thermal conductivity greater than or equal to 1 W/mK, and a resistivity greater than or equal to $5 \times 10^{-5}$ Ω-cm.

11. The method of claim 1, wherein the ceramic sheet has a thickness less than or equal to 50 µm, a tensile strength greater than or equal to 600 MPa, an inductance of less than or equal to 0.1 mH, an oxidization resistance of greater than or equal to 1000° C., and is chemically inert to rare-earth barium copper oxide.

12. The method of claim 1, wherein the ceramic sheet has an average grain size of less than or equal to 0.2 µm and a porosity of less than or equal to 5% by volume, and the ceramic sheet comprises zirconia, alumina, spinel, garnet, cordierite, mullite, perovskite, pyrochlore, silicon carbide, silicon nitride, boron carbide, titanium diboride, silicon alumina nitride, aluminum oxynitride, or combinations thereof.

13. The method of claim 1, further comprising disposing a first coating layer on the ceramic sheet that extends along the length of the ceramic sheet, wherein the first coating layer comprises nickel, yttria-stabilized zirconia, alumina, cerium oxide, magnesium oxide, rare-earth barium copper oxide, titanium, copper, or combinations thereof.

14. The method of claim 13, further comprising depositing a second coating layer on the ceramic sheet that extends along the length of the ceramic sheet, the second coating layer comprising titanium, nickel, copper, or combinations thereof.

15. The method of claim 14, further comprising depositing a third coating layer on the second coating layer that extends along the length of the ceramic sheet, the third coating layer comprising rare-earth barium copper oxide.

16. The method of claim 15, further comprising depositing a third coating layer the second coating layer, wherein the third coating layer comprises a high-temperature superconductor.

17. The method of claim 1, wherein the ceramic sheet comprises zirconia, alumina, spinel, garnet, cordierite, mullite, perovskite, pyrochlore, silicon carbide, silicon nitride, boron carbide, titanium diboride, silicon alumina nitride, aluminum oxynitride, or combinations thereof.

* * * * *